United States Patent
Lim et al.

(10) Patent No.: US 9,184,141 B2
(45) Date of Patent: Nov. 10, 2015

(54) ELECTROSTATIC DISCHARGE PROTECTION DEVICE

(75) Inventors: Dong-Ju Lim, Gyeonggi-do (KR); Woon-Ha Yim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 420 days.

(21) Appl. No.: 12/979,569

(22) Filed: Dec. 28, 2010

(65) Prior Publication Data

US 2011/0156147 A1 Jun. 30, 2011

(30) Foreign Application Priority Data

Dec. 30, 2009 (KR) .................. 10-2009-0134567

(51) Int. Cl.
*H01L 23/62* (2006.01)
*H01L 27/02* (2006.01)
*H01L 29/78* (2006.01)

(52) U.S. Cl.
CPC .............. *H01L 23/62* (2013.01); *H01L 27/027* (2013.01); *H01L 29/7835* (2013.01); *H01L 2924/0002* (2013.01)

(58) Field of Classification Search
CPC ..................... H01L 29/7835; H01L 29/7826
USPC .................................. 257/355, 408, E29.256
See application file for complete search history.

(56) References Cited

U.S. PATENT DOCUMENTS

| 2005/0212050 | A1* | 9/2005 | Kim et al. ..................... 257/355 |
| 2005/0224882 | A1* | 10/2005 | Chatty et al. .................. 257/355 |
| 2007/0120184 | A1* | 5/2007 | Cai et al. ....................... 257/335 |
| 2007/0221967 | A1* | 9/2007 | Khemka et al. ................ 257/288 |

FOREIGN PATENT DOCUMENTS

| KR | 1020050059609 | 6/2005 |
| KR | 1020060077116 | 7/2006 |
| KR | 100645193 | 11/2006 |

OTHER PUBLICATIONS

Notice of Allowance issued by the Korean Intellectual Property Office on Mar. 30, 2012.

* cited by examiner

*Primary Examiner* — Hsin-Yi Hsieh
(74) *Attorney, Agent, or Firm* — IP & T Group LLP

(57) ABSTRACT

An electrostatic discharge protection device includes first and second wells of a first conductivity type, the first and second wells having different impurity doping concentrations, respectively, a gate formed on the first well, a source region of a second conductivity type formed at one side of the gate in the first well, a drift region of the second conductivity type formed at the other side of gate and over both of the first well and the second well, and a drain region of the second conductivity type formed in the drift region of the second well.

7 Claims, 3 Drawing Sheets

ELECTROSTATIC DISCHARGE PROTECTION DEVICE

CROSS-REFERENCE TO RELATED APPLICATIONS

The present application claims priority of Korean Patent Application No. 10-2009-0134567, filed on Dec. 30, 2009, which is incorporated herein by reference in its entirety.

BACKGROUND OF THE INVENTION

Exemplary embodiments of the present invention relate to a semiconductor device fabrication technology, and more particularly, to an electrostatic discharge (ESD) protection device for protecting an internal circuit of a semiconductor device from ESD.

When a semiconductor integrated circuit (IC) comes in contact with a charged human body or machine, electrostatic discharge (ESD) charged in the human body or machine may be discharged to its internal circuits through external pins and pads of the semiconductor IC. At this time, a sudden current having high energy may cause severe damage to the internal circuits. In some cases, ESD charged in the semiconductor IC may flow out to the human body or machine due to the contact with the human body or machine and cause damage to the internal circuits.

As illustrated in FIGS. 1A and 1B, in order to protect internal circuits from such damages caused by ESD, most semiconductor ICs are provided with an ESD protection device between a pad and an internal circuit. In general, an ESD protection device uses transistors.

FIGS. 1A and 1B illustrate a conventional ESD protection device. Specifically, an ESD protection device using an NMOS transistor is exemplarily illustrated.

Referring to FIGS. 1A and 1B, the conventional ESD protection device includes a P-type well 12 formed on a substrate 11, a gate 13 formed on the substrate 11, an N-type source region 15 partially overlapped with one end of the gate 13, an N-type drain region 17 spaced apart from the other end of the gate 13 by a desired distance, an N-type drift region 16 surrounding the drain region 17 and partially overlapped with the other end of the gate 13, and a P-type pickup region 14 formed in the well 12. The drain region 17 is coupled to a pad, and the gate 13, the source region 15, and the pickup region 14 are coupled to a ground.

A breakdown phenomenon occurs when a voltage higher than a breakdown voltage (BV) is applied to the ESD protection device having the above-described structure. The lowest voltage of the ESD protection device after the occurrence of the breakdown phenomenon is referred to as a holding voltage ($V_h$). The breakdown voltage and the holding voltage are the most important parameters in the ESD protection device. The breakdown voltage and the holding voltage are desired to be higher than the power supply voltage in order that the characteristic of the ESD protection device cannot influence the operation of the internal circuit. In addition, the breakdown voltage and the holding voltage are to have a certain margin to cope with external variations.

However, the conventional ESD protection device having the above-described structure has a feature in that a holding voltage is low. Specifically, when ESD current flows into the ESD protection device through the pad, a horizontal parasitic bipolar (HPB) and a vertical parasitic bipolar (VPB) are simultaneously operated to run the ESD current to the ground through a bypass. In the case of the horizontal parasitic bipolar (HPB), the source region 15 and the drain region 17 serve as an emitter, and the well 12 under the gate 13 serves as a base. In the case of the vertical parasitic bipolar (VPB), the source region 15 and the drain region 17 serve as an emitter, and the well 12 under the drain region 17 serves as a base.

At this time, since a base width of the horizontal parasitic bipolar (HPB) which defines a channel length is short, a current gain of the horizontal parasitic bipolar (HPB) is larger than a current gain of the vertical parasitic bipolar (VPB). Thus, there is a concern that the holding voltage of the ESD protection device is reduced.

SUMMARY OF THE INVENTION

An embodiment of the present invention is directed to an ESD protection device which is capable of increasing a holding voltage thereof.

In accordance with an exemplary embodiment of the present invention, an electrostatic discharge protection device includes: first and second wells of a first conductivity type, the first and second wells having different impurity doping concentrations, respectively; a gate formed on the first well; a source region of a second conductivity type formed at one side of the gate in the first well; a drift region of the second conductivity type formed at the other side of the gate and over both of the first well and the second well; and a drain region of the second conductivity type formed in the drift region of the second well. The drain region may be coupled to a pad for flowing electrostatic discharge, and the gate and the source region may be coupled to a ground.

The impurity doping concentration of the second well may be higher than the impurity doping concentration of the first well. The impurity doping concentration of the drain region may be higher than the impurity doping concentration of the drift region. The drain region is spaced apart from the end of the other side of the gate by a first distance.

The electrostatic discharge protection device may further include: an impurity region of the second conductivity type formed in the first well to surround the source region; and a pickup region of the first conductivity type formed in the first well.

The impurity doping concentration of the source region may be higher than the impurity doping concentration of the impurity region. The pickup region may be coupled to a ground.

In accordance with another exemplary embodiment of the present invention, an electrostatic discharge protection device includes: first and second wells of a first conductivity type, the first and second wells having different impurity doping concentrations, respectively; a gate formed on the first well; a source region of a second conductivity type formed at one side of the gate in the first well; and a drain region of the second conductivity type formed in the second well.

DESCRIPTION OF SPECIFIC EMBODIMENTS

Figure 1A:
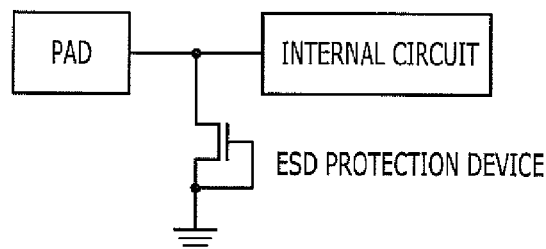
FIGS. 1A and 1B illustrate a conventional ESD protection device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

An embodiment of the present invention is directed to an ESD protection device using a transistor, which is capable of increasing a holding voltage ($V_h$), which is the lowest voltage of the ESD protection device after a breakdown phenomenon occurs. To this end, an impurity doping concentration of a well serving as a base of a vertical parasitic bipolar (VPB) is set to be higher than an impurity doping concentration of a well serving as a base of a horizontal parasitic bipolar (HPB), thereby increasing the holding voltages of the vertical parasitic bipolar (VPB) and the horizontal parasitic bipolar (HPB). Consequently, a total holding voltage of an ESD protection device is increased.

Hereinafter, an ESD protection device using an NMOS transistor will be exemplarily described. In the following description, a first conductivity type may be a P type, and a second conductivity type may be an N type. It is apparent that the present invention can also be applied to an ESD protection device using a PMOS transistor. In this case, the first conductivity type may be an N type, and the second conductivity type may be a P type.

Figure 2A:
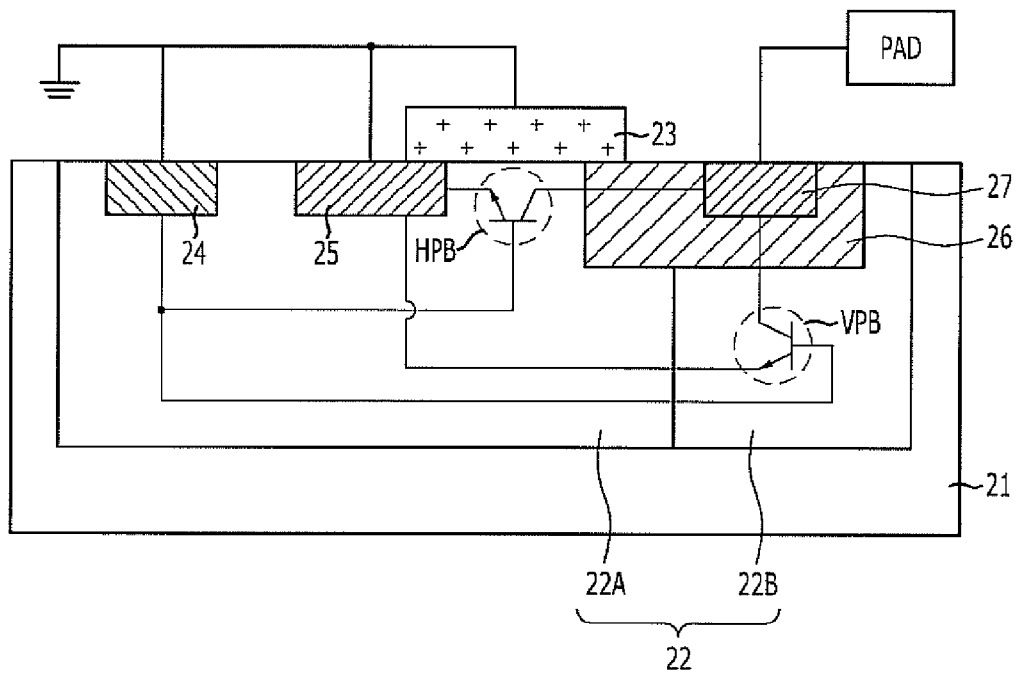
FIGS. 2A and 2B are cross-sectional views of an ESD protection device in accordance with an embodiment of the present invention
Figure 2B:
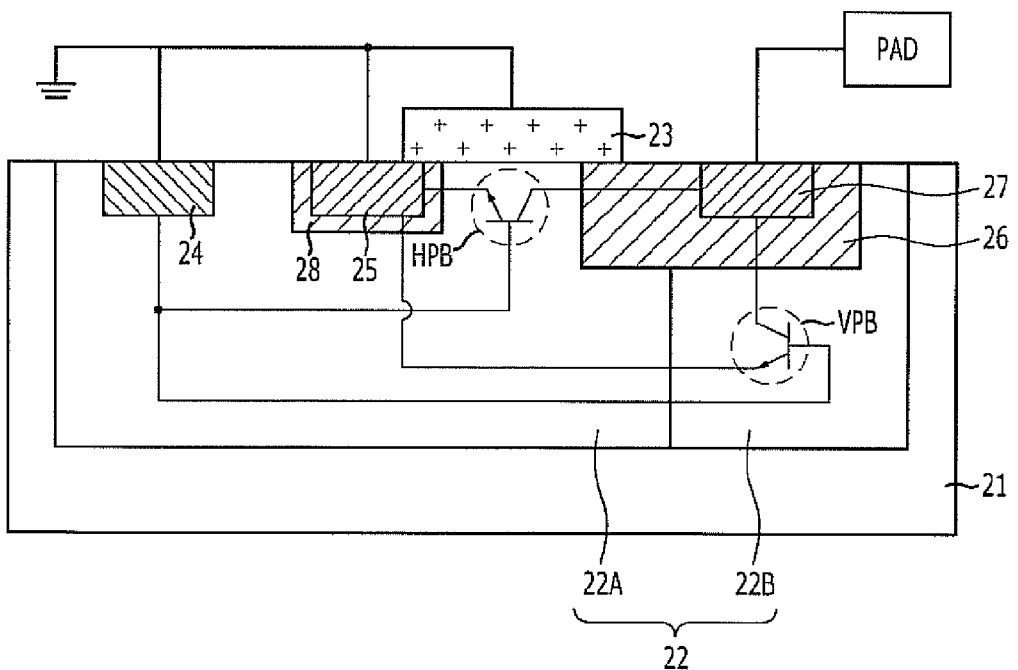

FIGS. 2A and 2B are cross-sectional views of an ESD protection device in accordance with an embodiment of the present invention.

Referring to FIGS. 2A and 2B, the ESD protection device in accordance with the embodiment of the present invention includes a well 22 of a first conductivity type formed on a substrate 21, a gate 23 formed on the substrate 21, a source region 25 of a second conductivity type partially overlapped with one end of the gate 23, a drain region 27 of the second conductivity type spaced apart from the other end of the gate 23 by a desired distance, a drift region 26 of the second conductivity type surrounding the drain region 27 and partially overlapped with the other end of the gate 23, and a pickup region 24 of the first conductivity type formed in the well 22. The drain region 27 is coupled to a pad, and the gate 23, the source region 25, and the pickup region 24 are coupled to a ground.

In addition, as illustrated in FIG. 2B, the ESD protection device may further include an impurity region 28 of the second conductivity type surrounding the source region 25. The impurity region 28 serves to increase a breakdown voltage between the well 22 and the source region 25 and also improve the stability of the source region 25 during operations. The impurity region 28 may have an impurity doping concentration lower than that of the source region 25.

The well 22 includes a first well 22A of the first conductivity type and a second well 22B of the first conductivity type. The pickup region 24 and the source region 25 are disposed in the first well 22A, and the drain region 27 is disposed within the drift region 26 so that it is overlapped with the second well 22B. The drift region 26 is disposed over both of the first well 22A and the second well 22B.

Since the second well 22B is overlapped with the drain region 27, it is also partially overlapped with the drift region 26. At this time, it is desirable to control the region of the second well 22B overlapped with only the drift region 26, except for the drain region 27, to be as small as possible. In particular, as the boundary between the first well 22A and the second well 22B moves from the drain region 27 to the source region 25, the second well 22B has more area overlapping with the drift region 26 outside an area of the drain region 27 and the breakdown voltage of the ESD protection device is reduced. In the ESD protection device using the transistor, as the breakdown voltage is reduced, the magnitude of a controllable ESD, for example, the magnitude of ESD voltage or ESD current, is reduced.

The drift region 26 serves to increase a breakdown voltage between the drain region 27 and the well 22 by dispersing a bias (e.g., a voltage or an electric field) applied to the drain region 27 through the pad. To this end, the drift region 26 may has an impurity doping concentration lower than that of the drain region 27.

The drain region 27 and the source region 25 coupled to the pad and the ground, respectively, may be formed by implanting impurity ions of a dose of $1\times10^{15}$ atoms/cm$^2$ or more in order to implement a low contact resistance.

The pickup region 24 serves to suppress the occurrence of a leakage current during operations and cause a voltage drop between the source region 25 and the well 22 when ESD current is applied to the ESD protection device. To this end, it is desirable that the impurity doping concentration of the pickup region 24 be higher than the impurity doping concentration of the well 22.

Meanwhile, in the case of an ESD protection device on which a silicide process is applied, the ESD protection device may be fabricated by additionally performing a silicide blocking process in order to prevent silicide from being formed on the drift region 26 and the drain region 27. This is because the characteristic of the ESD protection device is degraded when silicide having a relatively low resistance is formed on the drain region 27 coupled to the pad and the drift region 26 acting as an extended drain region.

The ESD protection device in accordance with the embodiment of the present invention is characterized in that the well 22 is provided with the first well 22A and the second well 22B having the same conductivity type, and the impurity doping concentration of the first well 22A is lower than the impurity doping concentration of the second well 22B. In this manner, the holding voltage of the ESD protection device can be increased. The principle which obtains the above-described effect will be described below in detail.

When ESD current flows into the ESD protection device through the pad, the horizontal parasitic bipolar (HPB) and the vertical parasitic bipolar (VPB) are simultaneously operated. Thus, the internal circuit can be protected from ESD through a series of operations of run the ESD current to the ground through a bypass. In the case of the horizontal parasitic bipolar (HPB), the source region 25 and the drain region 27 serve as an emitter, and the first well 22A under the gate 23 serves as a base. In the case of the vertical parasitic bipolar (VPB), the source region 25 and the drain region 27 serve as an emitter, and the second well 22B under the drain region 27 serves as a base.

Since the second well 22B under the drain region 27 has an impurity doping concentration higher than that of the first well 22A under the gate 23, the operating voltage of the vertical parasitic bipolar (VPB) is lower than the operating voltage of the horizontal parasitic bipolar (HPB). Therefore, a conduction path through the vertical parasitic bipolar (VPB) is formed by a lower operating voltage than a conduction path through the horizontal parasitic bipolar (HPB). Consequently, an amount of a current flowing through the conduction path formed by the horizontal parasitic bipolar (HPB) may be reduced. In this manner, the current gain of the horizontal parasitic bipolar (HPB) is reduced and thus the holding voltage of the vertical parasitic bipolar (VPB) increases.

In addition, since the operating voltage of the vertical parasitic bipolar (VPB) is lower than the operating voltage of the horizontal parasitic bipolar (HPB), an amount of a current flowing through the base (i.e., the first well 22A) in the conduction path by the horizontal parasitic bipolar (HPB) can be increased. Thus, even though the horizontal parasitic bipolar (HPB) has a short base width (i.e., a channel length), the holding voltage of the horizontal parasitic bipolar (HPB) can be increased.

As described above, the ESD protection device in accordance with the embodiment of the present invention can increase the holding voltage by configuring the well 22 with the first well 22A and the second well 22B whose impurity doping concentration is higher than that of the first well 22A.

As the holding voltage of the ESD protection device is increased, the area of the ESD protection device can be reduced. In addition, influence of the ESD protection device on the internal circuit coupled to the ESD protection device may be minimized/reduced during an operation of the internal circuit.

Figure 3:
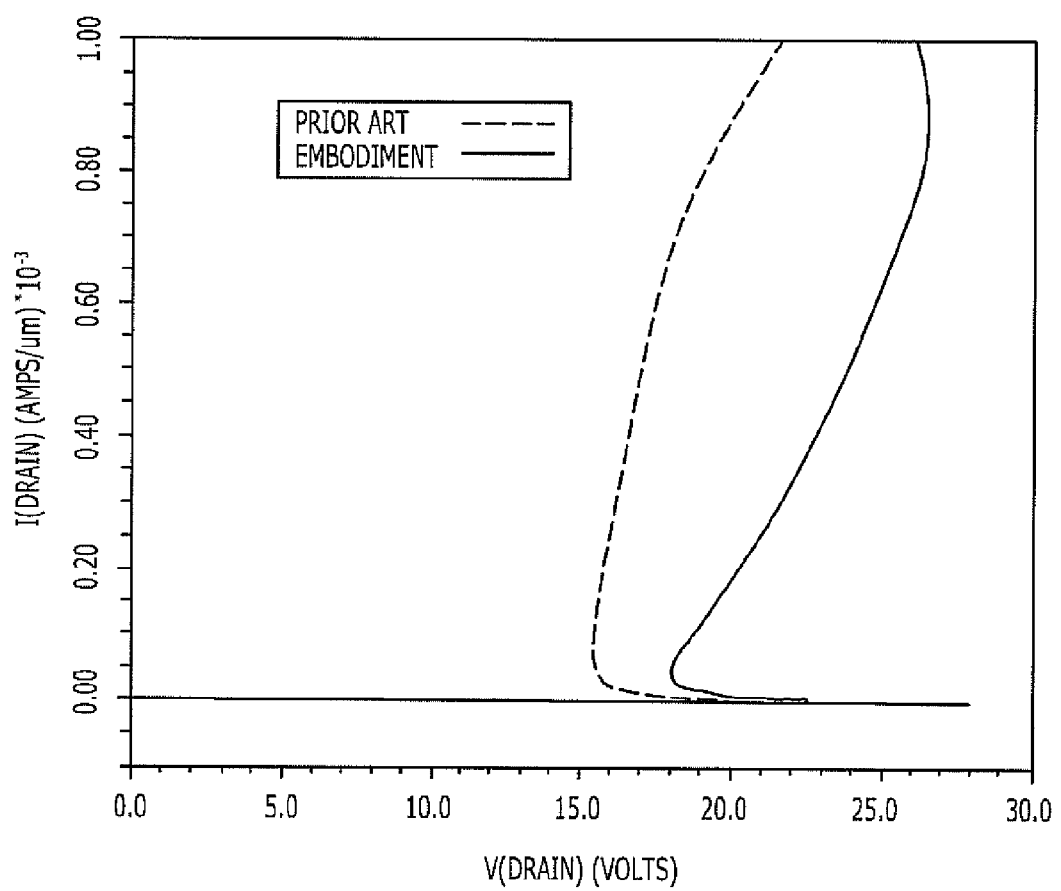
FIG. 3 is a graph showing comparison of the holding voltage of the ESD protection device between the prior art and the embodiment of the present invention.

FIG. 3 is a graph showing comparison of the holding voltage of the ESD protection device between the prior art and the embodiment of the present invention.

Figure 1B:
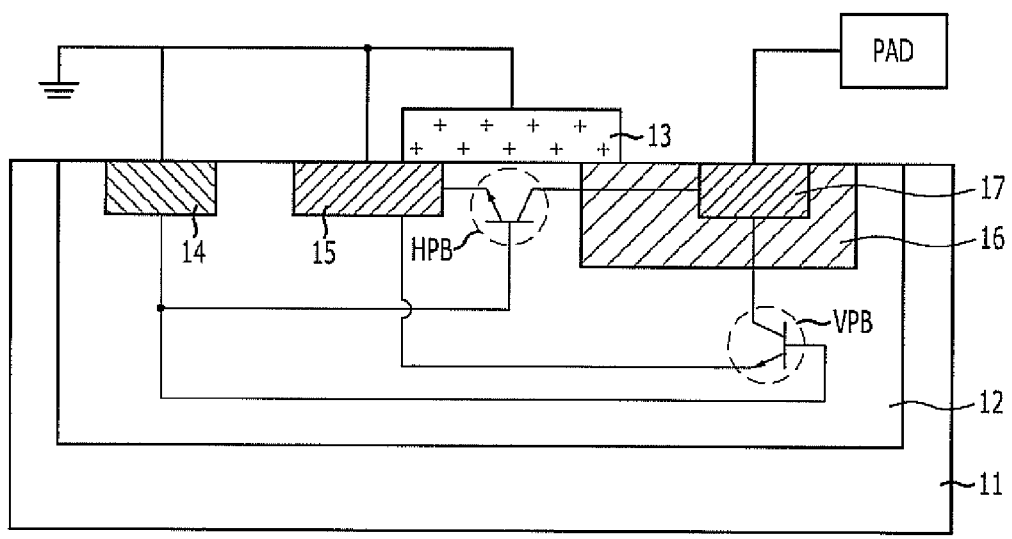

As can be seen from FIG. 3, while the holding voltage of the conventional ESD protection device (see FIG. 1B) is 15 V, the holding voltage of the ESD protection device in accordance with the embodiment of the present invention (see FIGS. 2A and 2B) is 18 V, which is increased by 20% with respect to the prior art.

In accordance with the embodiment of the present invention, the first well and the second well are formed to have different impurity doping concentrations, and the operating voltage of the vertical parasitic bipolar in which the second well serves as the base is lower than the operating voltage of the horizontal parasitic bipolar in which the first well serves as the base. In this manner, the holding voltage of the ESD protection device can be increased.

While the present invention has been described with respect to the specific embodiments, it will be apparent to those skilled in the art that various changes and modifications may be made without departing from the spirit and scope of the invention as defined in the following claims.

What is claimed is:

1. An electrostatic discharge protection device, comprising:
   a first well having a first conductivity type and a second well having the first conductivity type, the entirety of the first well having a first impurity doping concentration and the second well having a second impurity doping concentration that is higher than the first impurity doping concentration;
   a gate formed on the first well;
   a source region, having a second conductivity type opposite to the first conductivity type, formed, in the first well, at one side of the gate;
   a drift region, having the second conductivity type, formed in the first well and in the second well, at another side of the gate; and
   a drain region, having the second conductivity type, formed in a portion of the drift region that is formed in the second well,
   wherein the second well is formed to contact to a partial portion of a bottom of the drift region formed between the first well and the second well.

2. The electrostatic discharge protection device of claim 1, wherein the drain region is connected to a pad to discharge an electrostatic charge, and wherein the gate and the source region are connected to a ground.

3. The electrostatic discharge protection device of claim 1, wherein an impurity doping concentration of the drain region is higher than an impurity doping concentration of the drift region.

4. The electrostatic discharge protection device of claim 1, wherein the drain region is spaced apart from an end of the other side of the gate by a predetermined distance.

5. The electrostatic discharge protection device of claim 1, further comprising:
   an impurity region, having the second conductivity type, formed in the first well to surround the source region; and
   a pickup region, having the first conductivity type, formed in the first well.

6. The electrostatic discharge protection device of claim 5, wherein an impurity doping concentration of the source region is higher than an impurity doping concentration of the impurity region.

7. The electrostatic discharge protection device of claim 5, wherein the pickup region is connected to a ground.

* * * * *